(12) United States Patent
Wenderoth et al.

(10) Patent No.: US 10,910,531 B2
(45) Date of Patent: Feb. 2, 2021

(54) OPTOELECTRONIC COMPONENT AND METHOD FOR PRODUCING AN OPTOELECTRONIC COMPONENT

(71) Applicant: OSRAM Opto Semiconductors GmbH, Regensburg (DE)

(72) Inventors: Patrick Wenderoth, St. Ingbert (DE); Ulf Betke, Magdeburg (DE); Guido Kickelbick, St. Ingbert (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/328,680

(22) PCT Filed: Aug. 16, 2017

(86) PCT No.: PCT/EP2017/070780
§ 371 (c)(1),
(2) Date: Feb. 26, 2019

(87) PCT Pub. No.: WO2018/036883
PCT Pub. Date: Mar. 1, 2018

(65) Prior Publication Data
US 2019/0207067 A1 Jul. 4, 2019

(30) Foreign Application Priority Data
Aug. 26, 2016 (DE) .................. 10 2016 115 907

(51) Int. Cl.
*H01L 33/56* (2010.01)
*C08G 77/04* (2006.01)
(Continued)

(52) U.S. Cl.
CPC ............ *H01L 33/56* (2013.01); *C08G 77/045* (2013.01); *C08G 77/12* (2013.01); *C08G 77/50* (2013.01);
(Continued)

(58) Field of Classification Search
CPC ...... H01L 21/0274; H01L 33/56; C08G 77/12
(Continued)

(56) References Cited

U.S. PATENT DOCUMENTS 7,109,527 B2  9/2006 Illek et al.
7,709,852 B2  5/2010 Hohn et al.
(Continued)

FOREIGN PATENT DOCUMENTS

DE  102012104363 A  11/2013
EP  0905792 A2  3/1999
(Continued)

OTHER PUBLICATIONS

Hamdani, S. et al., "Flame Retardancy of Silicone-Based Materials," Polymer Degradation and Stability, vol. 94, Issue 4, Elsevier Ltd., 2009, pp. 465-495.
(Continued)

*Primary Examiner* — Igwe U Anya
(74) *Attorney, Agent, or Firm* — Slater Matsil, LLP

(57) ABSTRACT

An optoelectronic component and a method for producing an optoelectronic component are disclosed. In an embodiment an optoelectronic component includes an optical element including silicone as a polymer material, the silicone having repeating units of cyclic siloxane and of linear siloxane which are arranged in alternation, wherein the optoelectronic component is configured to emit radiation.

19 Claims, 5 Drawing Sheets

(51) Int. Cl.
*C08G 77/12* (2006.01)
*C08G 77/50* (2006.01)
*C08L 83/04* (2006.01)
*C08G 77/20* (2006.01)

(52) U.S. Cl.
CPC .............. *C08L 83/04* (2013.01); *C08G 77/20* (2013.01); *H01L 2933/005* (2013.01)

(58) Field of Classification Search
USPC .......................................................... 257/98
See application file for complete search history.

(56) References Cited

U.S. PATENT DOCUMENTS

| | | |
|---|---|---|
| 9,496,467 B2 | 11/2016 | Schmidtke et al. |
| 2002/0183516 A1* | 12/2002 | Denmark ................ C07B 37/04 540/555 |
| 2006/0106187 A1* | 5/2006 | Kennedy .................. C07F 7/21 528/33 |
| 2006/0275617 A1* | 12/2006 | Miyoshi ................. C08L 83/04 428/448 |
| 2010/0225010 A1* | 9/2010 | Katayama ............... C08L 83/04 257/791 |
| 2011/0098420 A1* | 4/2011 | Takizawa ............... C08L 83/04 525/477 |
| 2012/0029157 A1* | 2/2012 | Kim ........................ C08L 83/04 525/477 |
| 2012/0142956 A1* | 6/2012 | Neumann .............. C08G 77/08 556/462 |
| 2013/0075154 A1* | 3/2013 | Saito ...................... C08L 83/04 174/536 |
| 2013/0281713 A1* | 10/2013 | Willson ................ C07F 7/0874 549/215 |
| 2013/0330989 A1 | 12/2013 | Im et al. |
| 2014/0110750 A1* | 4/2014 | Ko .......................... C08L 83/04 257/100 |
| 2014/0221549 A1* | 8/2014 | Webster ................ C08G 77/26 524/500 |
| 2015/0038220 A1* | 2/2015 | Kuznetsov ............. G06Q 30/06 463/26 |

FOREIGN PATENT DOCUMENTS

| | | |
|---|---|---|
| JP | 2012162704 A | 8/2012 |
| WO | 9812757 A1 | 3/1998 |
| WO | 0213281 A1 | 2/2002 |

OTHER PUBLICATIONS

Zheng, P. et al., "Rediscovering Silicones: Molecularly Smooth, Low Surface Energy, Unfilled, UV/Vis-Transparent, Extremely Cross-Linked, Thermally Stable, Hard, Elastic PDMS," American Chemical Society, Langmuir Letter, vol. 26, (24), Nov. 29, 2010, pp. 18585-18590.

Zheng, P. et al., "D4H/D4V Silicone: A Replica Material with Several Advantages for Nanoimprint Litography and Capillary Force Lithography," American Chemical Society, Langmuir Letter, vol. 27, (13), May 31, 2011, pp. 7976-7979.

* cited by examiner

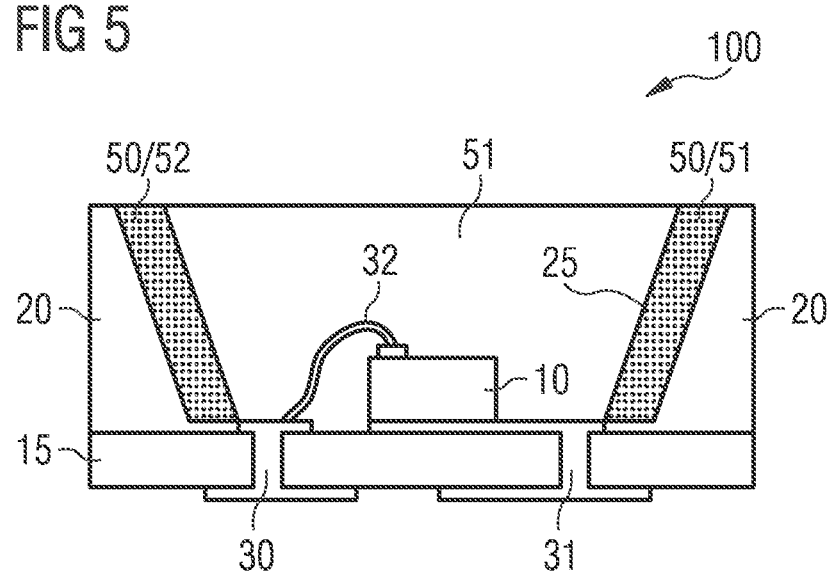

OPTOELECTRONIC COMPONENT AND METHOD FOR PRODUCING AN OPTOELECTRONIC COMPONENT

This patent application is a national phase filing under section 371 of PCT/EP2017/070780, filed Aug. 16, 2017, which claims the priority of German patent application 102016115907.7, filed Aug. 26, 2016, each of which is incorporated herein by reference in its entirety.

TECHNICAL FIELD

The invention relates to an optoelectronic component. Furthermore, the invention relates to a method for producing an optoelectronic component.

BACKGROUND

In optoelectronic components, for example, light-emitting diodes (LEDs), silicones are often used for optical elements, for example, for a potting. Silicones can, for example, be crosslinked by crosslinking 1,3,5,7-tetramethylcyclotetrasiloxane ($D_4^H$) and 1,3,5,7-tetramethyl-1,3,5,7-tetravinylcyclotetrasiloxane ($D_4^{Vi}$), resulting in highly transparent, temperature-stable but brittle glassy silicones. On the other hand, crosslinking silicones can be produced as two-component systems, which are usually softer and more flexible, but have lower thermal stabilities compared to pure ring-shaped siloxanes.

SUMMARY OF THE INVENTION

Embodiments provide an optoelectronic component with an optical element that is stable with respect to environmental influences and at the same time has a high degree of flexibility. Further embodiments provide a method for producing an optoelectronic component that produces the optoelectronic component described above with high stability and flexibility.

The above mentioned disadvantages can be overcome, for example, by combining ring-shaped siloxanes with linear siloxanes. This increases the stability and flexibility of the silicone, which also has better temperature resistance than conventional commercial silicone products.

The optoelectronic component is designed to emit radiation in at least one embodiment. The optoelectronic component has an optical element. The optical element comprises a silicone as a polymer material. The silicone has repeating units of a cyclic siloxane and of a linear siloxane which are arranged in alternation.

According to at least one embodiment, the optoelectronic component is a light-emitting diode (LED). The optoelectronic component is designed to emit radiation. In other words, the component emits radiation during operation, especially from the visible spectral range, for example, white mixed light.

In the following, the optoelectronic component can also be referred to briefly as a component. Silicones can also be referred to as polysiloxanes. Silicones are preferably referred to as polyorganosiloxanes or polyalkylarylsiloxanes. The fact that a silicone has a repeating unit or repeating units of a cyclic siloxane and of a linear siloxane which are arranged (with respect to each other) in alternation, can mean here and in the following that the silicone backbone has alternating units of a cyclic siloxane and a linear siloxane which are covalently linked to one another.

In the cyclic siloxanes, the cyclic structure is formed from Si—O units. Preferably the cyclic siloxanes have at least three or four Si—O units. The silicon atoms in the cyclic siloxane may also be substituted with radicals, for example, with the radicals $R_{12}$ to $R_{15}$. The radicals may be independently selected from a group comprising H, alkyl, alkylene, alkylarylene, cycloalkyl and aryl.

In the linear siloxanes, the linear structure is formed from Si—O units. In other words, linear siloxanes do not form a cyclic ring structure. The linear structures can be branched or unbranched. For example, linear chains can branch off at the siloxane skeleton. These can include alkyl, alkylene, alkylarylene, cycloalkyl and aryl, or siloxanes.

According to at least one embodiment, cyclic siloxanes have the following structural unit:

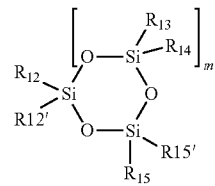

The radicals $R_{12}$, $R_{12'}$, $R_{13}$, $R_{14}$, $R_{15}$, $R_{15'}$ may independently be selected from a group comprising H, alkyl, alkylene, alkylarylene, cycloalkyl and aryl. m may be between 1 and 3, preferably 2. The branching of the cyclic siloxane can take place via $R_{12}$ or $R_{12'}$ and/or $R_{15}$ or $R_{15'}$.

According to at least one embodiment, the cyclic siloxanes are crosslinked and have the following structural unit:

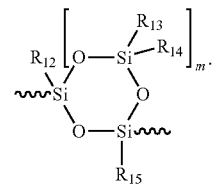

The radicals $R_{12}$ to $R_{15}$ may independently be selected from a group comprising H, alkyl, alkylene, alkylarylene, cycloalkyl and aryl. Alternatively or additionally, the position $R_{14}$ may be branched. A branching may occur at any Si atom.

According to at least one embodiment, linear siloxanes have the following structural unit:

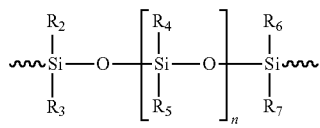

The radicals $R_2$ to $R_7$ may independently be selected from a group comprising H, alkyl, alkylene, alkylarylene, cycloalkyl and aryl.

According to at least one embodiment, the silicone is formed from repeating units of cyclic siloxanes and of linear siloxanes. The silicone preferably has the following structural formula:

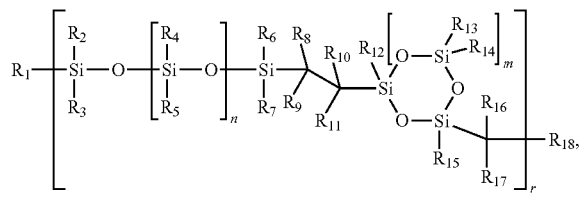

wherein $R_1$ to $R_{18}$ are independently selected from a group comprising H, alkyl, alkylene, alkylarylene, cycloalkyl, siloxane and aryl, n is selected between 1 and 1000, preferably 1 and 200 or 1 to 15 or 1 to 5, m is selected between 1 and 3, preferably 2, and r is selected between 1 and 100, preferably 1 to 20.

Additional crosslinking points may occur in the progress of radicals $R_1$ and $R_{18}$.

According to an embodiment, the units of cyclic siloxanes and the units of linear siloxanes are linked by hydrosilylation.

The inventors have recognized that by crosslinking oligomers or molecular silicone species, preferably by combining units of cyclic siloxanes with linear siloxanes, it is possible to produce a silicone as a polymer material that has thermal stability and flexibility at the same time, enabling the silicone excellently to be applied as an optical element for optoelectronic devices. The silicones can be produced by hydrosilylation, so that the one unit of the siloxanes has one or more C=C double bonds, for example, Si vinyl units, and the other unit of the siloxanes has a silane with Si—H units, which add together and form the silicone. The hydrosilylation reaction can take place according to the following reaction:

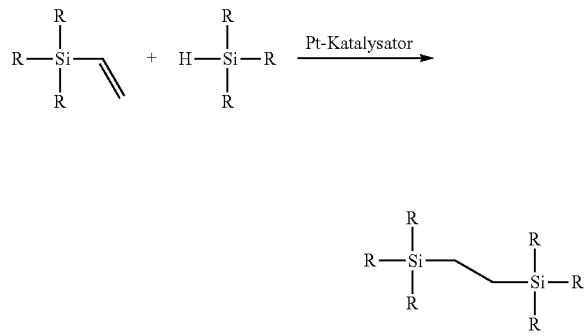

The reaction principle is used in many commercially available products, for example, by the companies Wacker, Shin-Etsu and Dow Corning, to produce transparent encapsulation materials for optoelectronic components or other optoelectronic applications. The commercial reaction mixtures mainly contain linear polysiloxanes with vinyl or hydride functionalized end groups as well as various additives such as adhesion promoters or molecules modified in the side chains to achieve a higher degree of crosslinking. This has, for example, an influence on the haptics of the products or of the silicones, for example, whether they are rubber-like or brittle, as well as on the thermal resistance of the material.

Linear siloxanes can usually degrade via the intramolecular backbiting mechanism (see following reaction equation). Typical siloxanes show signs of aging due to thermal stress at temperatures as low as 200° C.

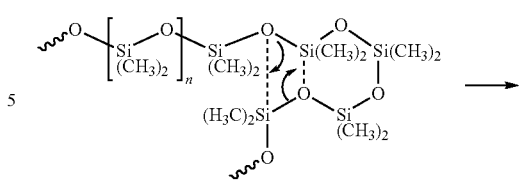

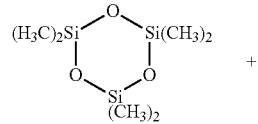

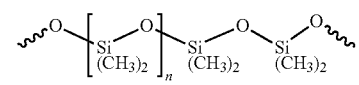

As an alternative to the silicone described here, silicones can also be used, both of which have a cyclic structure. The disadvantage, however, is that comparatively strong cross-links are created which, when these components are combined, produce a very hard, brittle and glassy product which, however, is stable up to 500° C. in a nitrogen atmosphere. For example, the following cyclic siloxanes $D_4^H$ (right) or $D_4^{vi}$ (left) can be used.

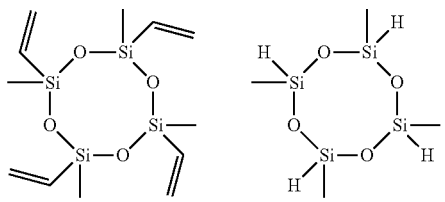

In order to slow down or prevent the degradation of linear siloxanes, backbiting must be prevented. This should be possible by cross-linking, which inhibits the intramolecular formation of cyclic degradation products. The inventors have now recognized that by using cyclic siloxanes and linear siloxanes to form a silicone, an optical element can be provided for an optoelectronic device that has a high thermal stability and crosslinking of the silicone and at the same time exhibits very good flexibility for the application in LEDs.

According to at least one embodiment, $R_1$ is a vinyl group or a vinyl-containing radical and/or $R_{18}$ is hydrogen or Si hydrogen. In other words, the radicals $R_1$ and $R_{18}$ are suitable for hydrosilylation.

According to at least one embodiment m=2. In other words a cyclic siloxane with four Si—O units can be provided.

According to at least one embodiment m=2, $R_1$ is a vinyl-containing radical and $R_{12}$ to $R_{15}$ are each H or $CH_3$. In particular, the silicone thus has the following structure:

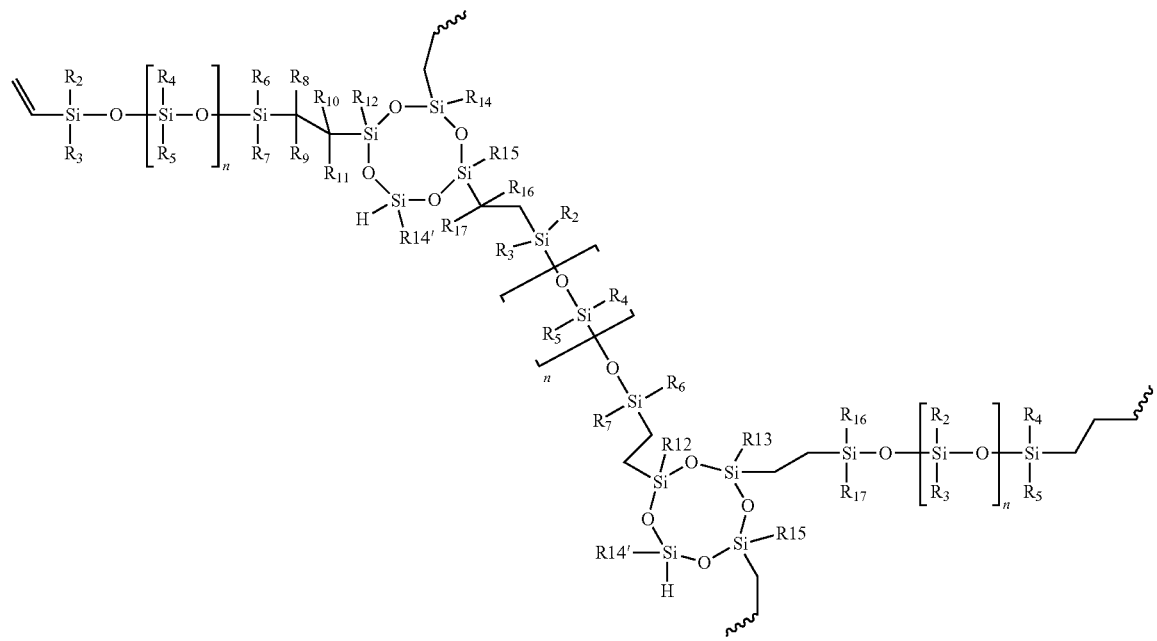

The crosslinking can take place alternatively or additionally via $R_{12}$, $R_{13}$, $R_{14}$ and/or $R_{15}$, $R_2$ to $R_{17}$ and $R_{14'}$ can mean the same as described above for $R_1$ to $R_{18}$. The H radicals can also be alkyl, alkylene, alkylarylene, cycloalkyl, siloxane or aryl.

The cyclic siloxane and the linear siloxane are mixed in a ratio of 1:1 to 1:10, preferably stoichiometrically 1:1, according to at least one embodiment. The resulting silicone has alternating repeating units of cyclic siloxanes and linear siloxanes.

According to at least one embodiment, the optical element is formed as a potting and surrounds a semiconductor chip. The semiconductor chip can also be directly encapsulated by the potting or the optical element. Due to the improved mechanical properties of the silicone, which is both thermally very stable and flexible, it is very well suited for encapsulating semiconductor chips. The potting is preferably transparent to the radiation emitted by the semiconductor chip. The encapsulation can be arranged in a recess of a housing of an optoelectronic component. The recess can then, for example, be sealed with the optical element as potting and protect the semiconductor chip from harmful environmental influences.

The semiconductor chip can in particular be a radiation-emitting semiconductor chip, for example, an LED chip. This can be in combination with a growth substrate or can also be designed as a thin-film light emitting diode chip. Examples of thin-film light emitting diode chips are described in EP 0905792 A2 and in WO 02/13281 A1, the disclosure contents of which are hereby taken up by reference. The semiconductor chip may contain semiconductor materials.

According to at least one embodiment, the semiconductor chip comprises a semiconductor layer sequence. The semiconductor layer sequence is preferably based on a III-V compound semiconductor material. The semiconductor material may preferably be based on a nitride compound semiconductor material. "Based on a nitride compound semiconductor material" in the present context means that the semiconductor layer sequence or at least one layer thereof comprises a III-nitride compound semiconductor material, preferably $In_xAl_yGa_{1-x-y}N$, where $0 \le x \le 1$, $0 \le y \le 1$ and $x+y \le 1$. This material does not necessarily have to have a mathematically exact composition according to the above formula. Rather, it may contain one or more dopants and additional components which essentially do not alter the characteristic physical properties of the $In_xAl_yGa_{1-x-y}N$ material. For simplicity's sake, however, the above formula contains only the essential components of the crystal lattice (In, Al, Ga, N), even if these may be partially replaced by small amounts of other substances.

The semiconductor layer sequence comprises an active layer with at least one pn junction and/or with one or more quantum well structures. During operation of the conversion semiconductor chip, electromagnetic radiation is generated in the active layer. A wavelength or maximum wavelength of radiation is preferably in the ultraviolet and/or visible spectral range, especially at wavelengths between 420 nm and 680 nm inclusive, for example, between 440 nm and 480 nm.

According to at least one embodiment, the optical element comprises a lens or is formed as a lens. The optical element may be a separately produced lens which is subsequently placed on the device. For example, an adhesive can be used to attach the lens to the optical element. Such a lens can, for example, be cast and hardened in a mold. The optical element can, however, also be a potting, as described above, which surrounds the semiconductor chip and is at least partially formed into a lens.

According to at least one embodiment, the optical element is formed as a reflector. Alternatively or additionally, the optical element can also contain a reflective filler. For example, the optical element can contain 10 to 80% by weight, in particular 20 to 60% by weight, of reflective fillers. For example, titanium dioxide, zirconium dioxide, aluminum oxide and combinations thereof can be used as reflective fillers. For example, the reflector can be arranged on the surface of the recess and thus reflect the radiation emitted by the semiconductor chip and decouple it from the component.

According to at least one embodiment, converter materials are embedded in the optical element. Converter materials are designed to convert the radiation emitted by the semiconductor chip into radiation with a changed, usually longer wavelength. The choice of converter materials is not limited by this application, so that all converter materials suitable for volume conversion can be used in this embodiment. Examples of such converter materials are described in WO 98/12757 A1, the contents of which are hereby incorporated by reference. The converter material can be present as a component of particles, for example, together with binding agents. The particles can also consist of the converter material. The heat generated by conversion can be easily dissipated due to the improved thermal conductivity of the silicone or polymer material, which can be attributed to the high degree of crosslinking in the silicone. This provides a stable chromaticity coordinate for the light emitted by the component. The thermal conductivity can be further increased by thermally conductive particles as described above.

The invention also concerns a method for producing an optoelectronic component. Preferably, the optoelectronic component described above is manufactured using this method. According to at least one embodiment, the process shows the steps: generating an optical element, providing a first material comprising a cyclic siloxane, providing a second material comprising a linear siloxane, wherein one of the two siloxanes is a silane and the other has at least one double bond, addition of a catalyst, and crosslinking of the cyclic siloxane and the linear siloxane by hydrosilylation to produce the silicone as a polymer material.

According to at least one embodiment, the crosslinking takes place at 100 to 150° C., for example, at 120° C.

According to at least one embodiment, the catalyst is a platinum catalyst. Preferably a Karstedt- or Ossko-catalyst is used as catalyst.

The inventors have recognized that by using the silicone described here, the positive properties of various already known approaches can be combined and the resulting silicone is suitable for optoelectronic applications. The silicone described here has a high proportion of ring-shaped molecules and thus a higher degree of crosslinking than conventional silicones. The proportion of ring-shaped molecules depends in particular on the chain length and/or molar mass of the linear siloxanes used. Preferably, the proportion of ring-shaped molecules is between 5 and about 30 mol %.

Thus an optical element can be provided, which has a high thermal stability and at the same time flexibility. With the optoelectronic component described here or the method for producing the optoelectronic component, commercial products can be used which are cross-linked with each other, thus providing an optical element according to the invention. Commercial systems are often characterized by the fact that they are usually already optimized for certain applications and easy to use. In most cases, these are two-component kits that contain other additives, such as the catalyst, in addition to the vinyl or hydride component. Both components are mixed in a certain ratio and subjected to a defined curing program. In particular, information on the exact composition, chain length or other molecular characteristics is usually difficult or impossible to obtain.

According to at least one embodiment, the following procedure can therefore be applied to commercial systems. First, it can be identified from the commercial systems which of the systems is a vinyl- or hydride-containing component. IR spectroscopy, for example, can be used for this purpose. Subsequently, it can be determined which of the two components is to be partially replaced or acted upon. Since the commercial systems contain an indefinable or indeterminable composition, it is generally not possible to calculate the molar ratios. Therefore, the cyclic additive, i.e., the cyclic siloxane, is added in different weight ratios and the optimum is empirically investigated. In order to keep the total ratio constant, the other component can be topped up accordingly. Thermogravimetric curves for such systems are shown, for example, in FIG. 1E.

Alternatively, cross-linking can also take place with other molecular or oligo- or polymer precursors. These often have the advantage that the molecular weight is known and therefore a stoichiometric ratio between hydride and vinyl groups can be set.

According to at least one embodiment, the corresponding components or siloxanes can be weighed and about 1 µl (for 5 to 10 g total) of platinum catalyst solution (about 2 to 2.5 ppm platinum) can be added. A Karstedt or Ossko catalyst, for example, can be used as a catalyst. The siloxanes and the catalyst are mixed. Crosslinking can then take place. Depending on the catalyst and the total quantity, the reaction time can be 1 to 4 hours. The crosslinking temperature should be between 100° C. and 150° C.

BRIEF DESCRIPTION OF THE DRAWINGS

Further advantages, advantageous embodiments and further developments result from the exemplary embodiments described in the following in connection with the figures.

FIGS. 2 to 5 show schematic side views of an optoelectronic component according to an embodiment.

In the exemplary embodiments and figures, identical, similar or equivalent elements can each be provided with the same reference signs. The elements shown and their proportions are not to be regarded as true to scale. Rather, individual elements, such as layers, components, devices and areas, can be displayed in an exaggeratedly large format for better representability and/or better understanding.

DETAILED DESCRIPTION OF ILLUSTRATIVE EMBODIMENTS

Figure 1A:
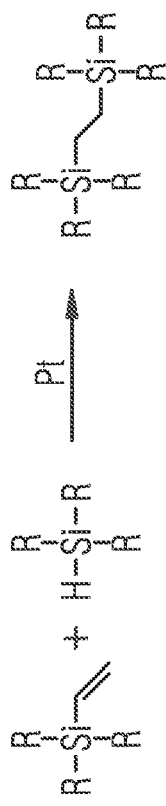
FIG. 1A shows a hydrosilylation reaction.

FIG. 1A shows the reaction of a silane with a vinyl-containing siloxane using a platinum catalyst. In other words, a silane is bound to a double bond under a syn-selective anti-Markovnikov addition. This binding can also be referred to as hydrosilylation. Such a reaction is described, for example, in "Hydrosilylation—A Comprehensive Review on Recent Advances", B. Marciniec (ed.), Advances in Silicon Science, Springer Science, 2009, doi: 10.1007/978-1-4020-8172-9.

Figure 1B:
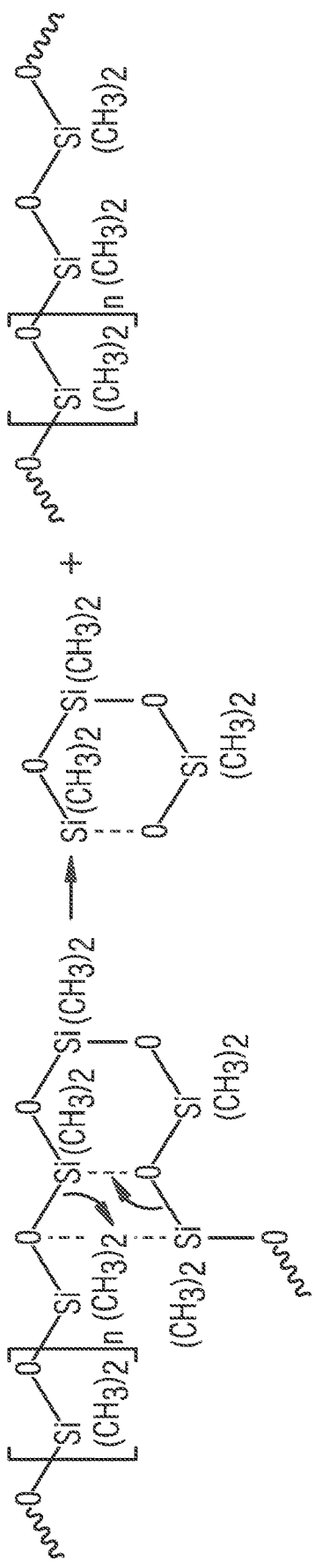
FIG. 1B shows a backbiting mechanism.

FIG. 1B shows the schematic representation of the so-called backbiting mechanism. In the backbiting mechanism, linear siloxane units can be degraded via an intramolecular mechanism. Cyclic siloxanes and residues of linear siloxane units are formed. Backbiting is described, for example, in Brook, M. A., "Silicon in Organic, Organometallic and Polymer Chemistry", Wiley, New York, 2000, ISBN: 978-0-471-19658-7.

Figure 1C:
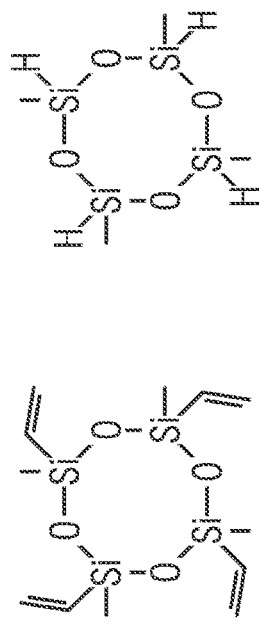
FIG. 1C shows the structural formulae of two cyclic siloxanes.

FIG. 1C shows the molecular structure of $D_4^{Vi}$ (left) and $D_4^H$ (right). These cyclic siloxanes have four Si—O units. It is therefore an eight-ring siloxane. Crosslinking these two cyclic siloxanes produces a silicone that has a strong crosslinking and is therefore very hard, brittle and glassy. It is therefore not very suitable for use as a potting compound for optoelectronic components.

Figure 1D:
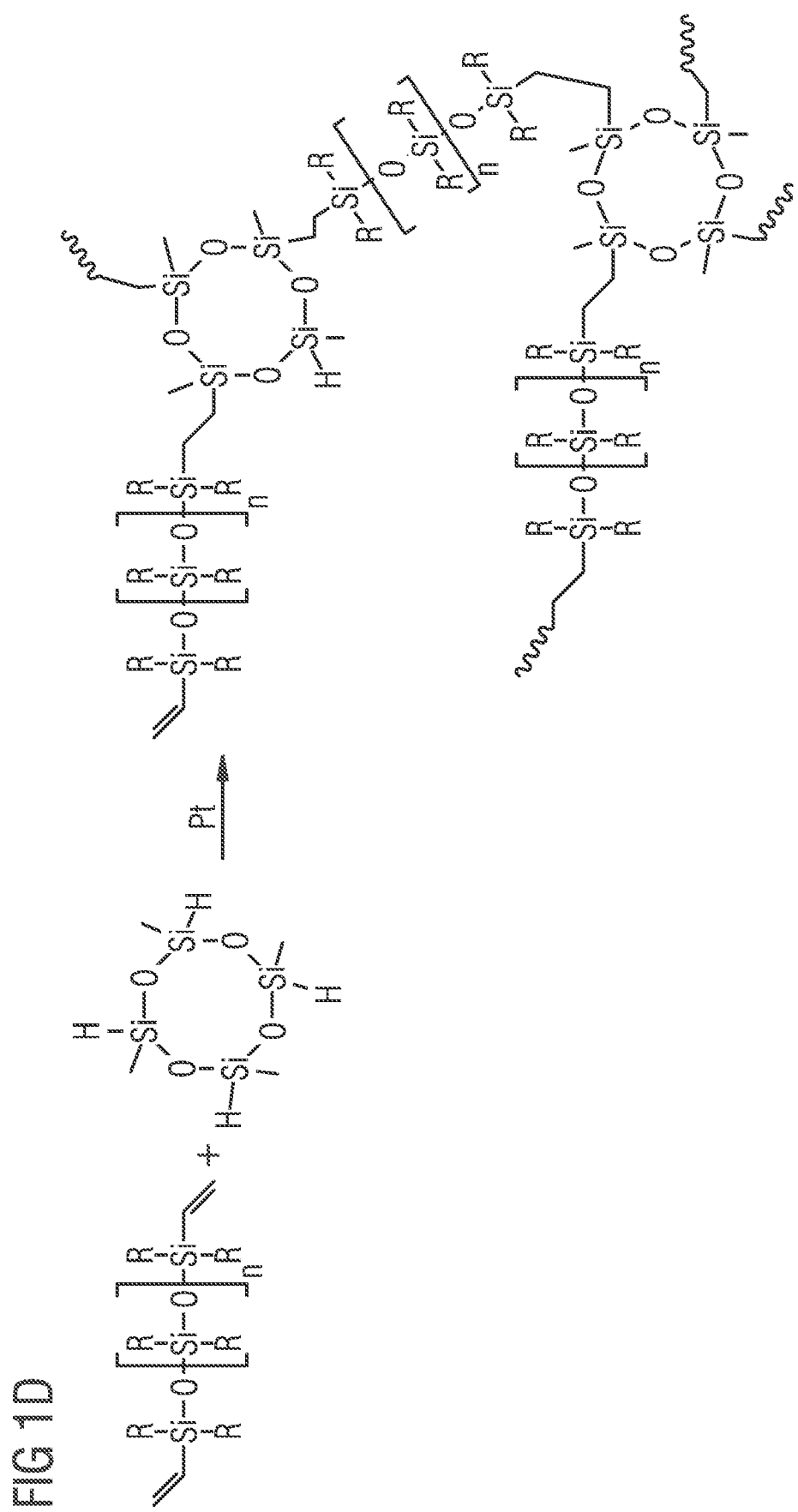
FIG. 1D shows the hydrosilylation of cyclic and linear siloxanes.
Figure 1E:
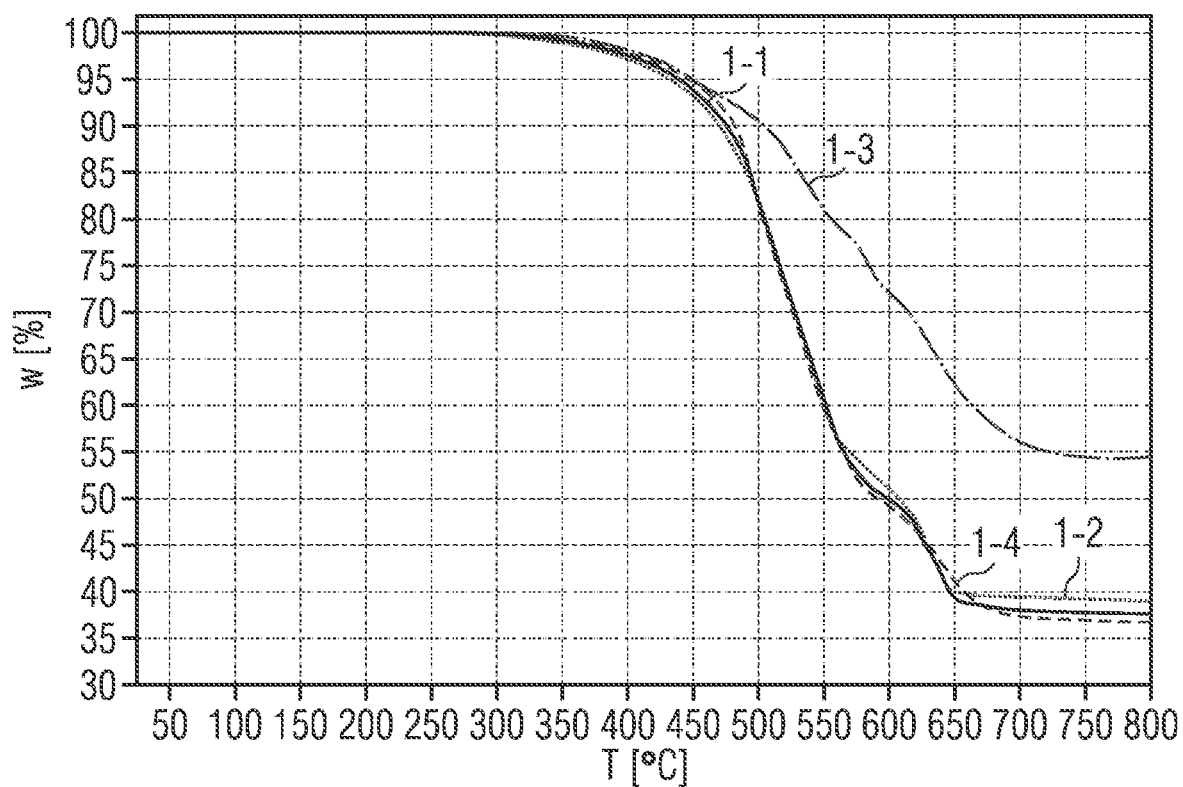
FIG. 1E shows thermogravimetric curves according to an exemplary embodiment and comparison examples.

FIG. 1D shows the reaction of the cyclic siloxane with the linear siloxane to form the silicone as a polymer material for the optical element 50 according to an embodiment. In general, it is possible in this context both to incorporate the $D_4$ molecules as additives in commercial products and to combine them with other linear or branched siloxanes. This makes it possible to provide a silicone with high thermal stability and flexibility at the same time. Effects of the addition of cyclic systems on the thermal properties of silicones could be shown by thermogravimetric measurements (FIG. 1E). The relative weight w in percent was plotted as a function of the temperature T in ° C. The weight of the silicones was measured by means of thermogravimetric measurements (FIG. 1E). As material the commercially available Shin-Etsu LPS 3541 was heated under oxygen atmosphere at 20 K/min heating rate. Shown are two samples of the original system (1-1 and 1-2) as well as 5% by weight addition of $D_4^{Vi}$ (1-3) and 10% by weight addition of $D_4^H$ (1-4).

It can be stated that there are optimal conditions, so that the thermal stability initially increases and decreases again with a too high proportion of cyclic systems or even no further curing can be observed. This is probably due to the fact that the mobility of the already cross-linked chains decreases and therefore not all reactive groups find a reaction partner. However, both free vinyl and hydride groups are potential weak points of polymers and should therefore be avoided by complete crosslinking.

According to the manufacturer, the material Shin-Etsu LPS 3541 is used as follows: The silicone is formed from two components, namely vinyl component A and hydride component B, which are mixed in a weight ratio of 1:1, corresponding to LPS-3541A resin and LPS-3541B hardener. These two components are thoroughly mixed, for example, by mechanical stirring, and then degassed under reduced pressure for about 30 minutes. The mixture can now be poured into a desired mold and is then cured for 4 hours at 150° C.

For example, the Shin-Etsu LPS 3541 systems shown in FIG. 1E are mixed by the manufacturer in a 1:1 weight ratio. For an addition of 10% by weight $D_4^H$, 1 g Si—H components, e.g., linear siloxanes with 0.1 g $D_4^H$ as cyclic siloxane, can be mixed and then 1.1 g Si-vinyl components can be added as a second linear siloxane. The components are stirred and subjected to the temperature program specified for the respective system, wherein, in particular, if the $D_4$ content is high, care must eventually be taken to ensure slow heating, otherwise bubbles may easily form.

In another example, Shin-Etsu LPS 3541 is crosslinked with cyclic siloxanes as follows: The desired siloxane, $D_4^{Vi}$ or $D_4^H$, is added in the appropriate quantity, for example, 200 mg per 2 g total mass of pure silicone LPS 3541, i.e., 1 g component A and 1 g component B. In order to compensate for the additional reactive groups, the same mass is also added to the complementary component, i.e., A if $D_4^H$ is used and B if $D_4^{Vi}$ is used. This results in a total mixture of 1 g component A, 200 mg $D_4^{Vi}$ and 1.2 g component B, for example.

The rest of the procedure preferably follows the same procedure as for Shin-Etsu LPS 3541, whereby the volatility of the cyclic siloxanes is advantageously taken into account during degassing, i.e., the final pressure should be selected accordingly high, and a slower heating rate should be selected during heating, especially with large additive quantities, in order to avoid foaming. A similar procedure is preferred for the use of cyclic siloxanes in other commercial products.

For the crosslinking of cyclic siloxanes with other linear or branched siloxanes, the following must be observed in particular: The use of commercial products as in the above example has the disadvantage that the exact parameters of the products such as chain length, degree of branching, additives for adjusting viscosity or adhesion, for example, are often not precisely known. In contrast, when using individually available siloxanes, it is easier to estimate the number of reactive groups, for example, and to coordinate them. For this purpose, it is advisable to optimize based on the stoichiometric ratio. The amount of platinum catalyst to be added should also be optimized for the desired application of the product in order to achieve complete curing on the one hand and to avoid the formation of platinum colloids or discolorations, which can occur with excessive amounts, on the other.

Figure 2:
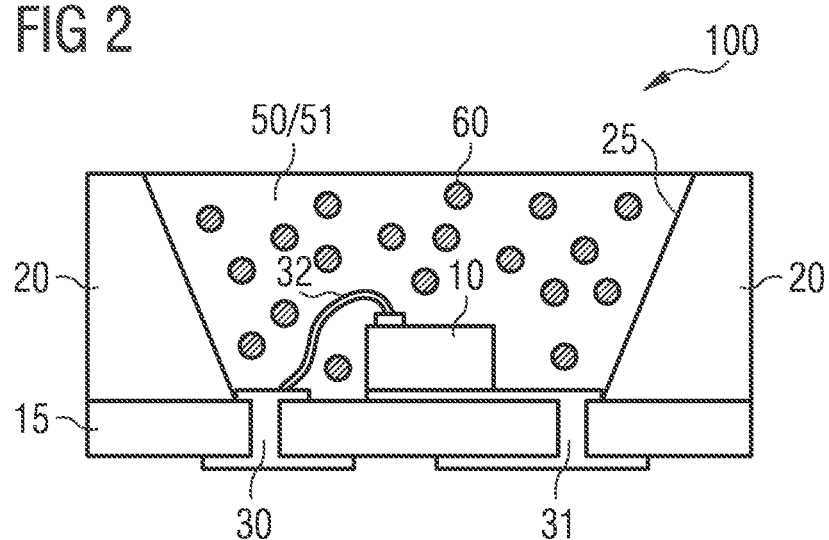

FIG. 2 shows a schematic side view of an optoelectronic component according to one embodiment. Here, for example, an LED is shown. The component 100 comprises a housing 20 in combination with a carrier substrate 15. The housing can comprise a ceramic or a heat- or radiation-resistant plastic. A semiconductor chip 10 is arranged in a recess 25 of the housing 20, which emits radiation during operation of the component 100. The side walls of the recess 25 are sloped here and can include a reflective material. The semiconductor chip 10 can be energized via electrically conductive terminals 30, 31 and a bonding wire 32.

The component 100 has an optical element 50. The optical element comprises a polymer material. The polymer material is a silicone. The silicone has repeating units of a cyclic siloxane and a linear siloxane which are arranged in alternation. The optical element 50 here is transparent to the radiation emitted by the semiconductor chip 10 and can be shaped as a lens (not shown here). In the example in FIG. 2, the optical element 50 can also be shaped as a potting 51, which surrounds the semiconductor chip 10. The optical element 50 can have particles 60, for example, converter materials or inorganic fillers homogeneously distributed in the optical element 50. Alternatively or additionally, the component 100 can include a conversion element 61, which can be arranged in the form of a platelet on the semiconductor chip 10 (not shown here). In addition, other inorganic fillers such as diffusers or thermally conductive particles such as silicon dioxide particles can be embedded in the optical element 50. The inorganic fillers, for example, can make up 10 to 80% by weight of the optical element 50. Component 100 can emit visible light with any color impression, especially white light.

The optical element 50 has a high thermal stability as well as a high flexibility, so that crack formation in the optical element 50 during operation of the component 100 is avoided.

Figure 3:
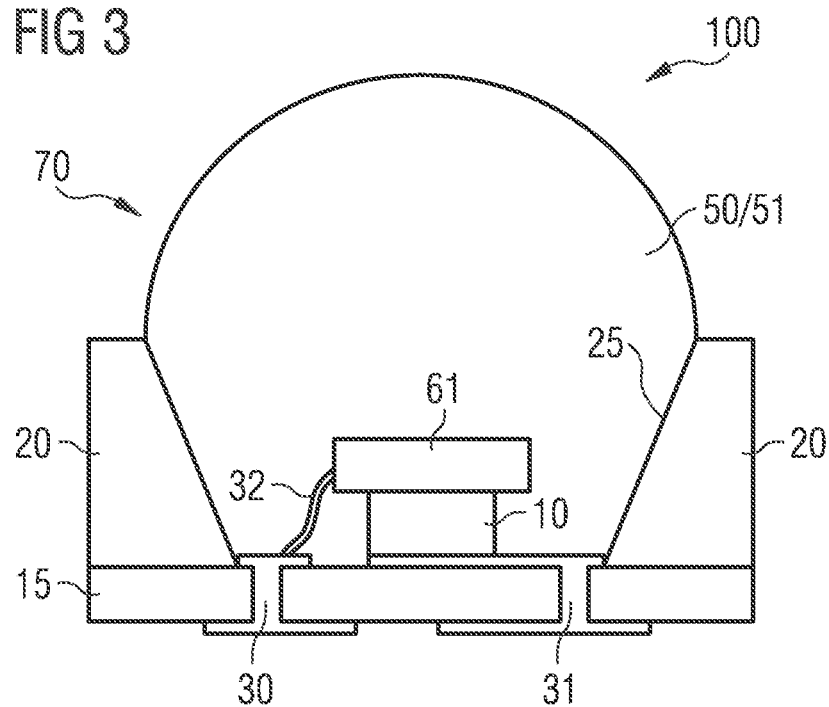

FIG. 3 shows a schematic side view of an optoelectronic component 100 according to one embodiment. The device essentially corresponds to the device 100 of FIG. 2. Instead of converter materials comprising particles 60, here a conversion element 61 is arranged on the semiconductor chip 10. The optical element 50 is formed here as lens 70, which can project beyond the housing 20.

Figure 4:
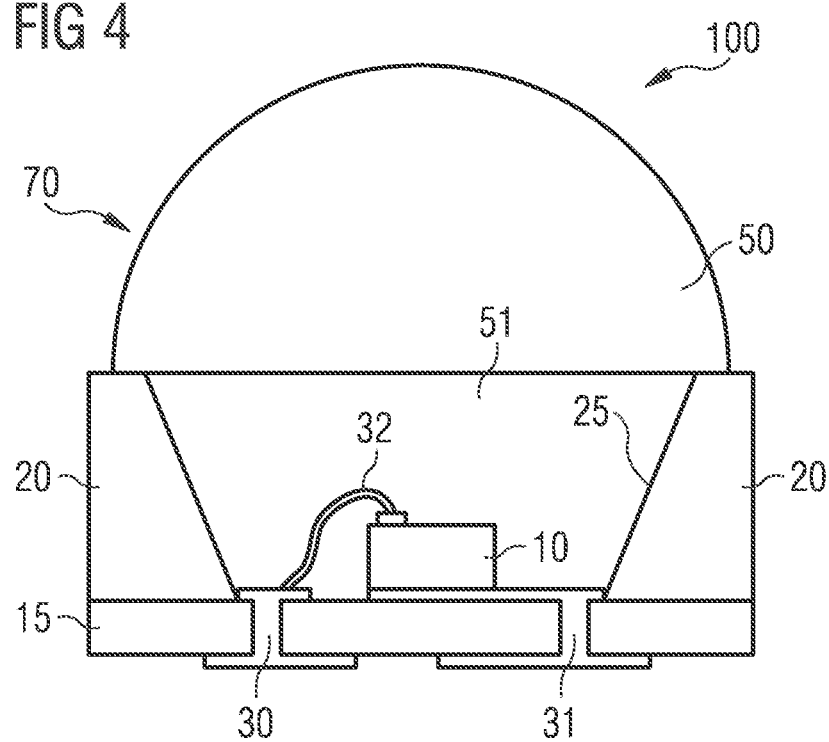

FIG. 4 shows a schematic side view of an optoelectronic component 100 according to an embodiment. As an optical element 50, it comprises a lens 70 which is arranged on the component 100, for example, by means of an adhesive. The optical element 50 comprises a silicon according to at least one embodiment according to the application. Such a lens 70 can be, for example, cast and hardened separately in mold. In this example, the semiconductor chip 10 is encased in a potting 51 that fills the recess 25. The potting 51 can also be an optical element 50 according to an embodiment of the application or consist of conventional materials. Component 100 can include converter materials 60, for example, in the form of particles or a platelet (not shown here).

FIG. 5 shows a schematic side view of an optoelectronic component 100 according to one embodiment. The optical element 50 here is designed as a reflector 52 and can comprise a reflective filler. The reflective filler can make up 10 to 80% by weight, in particular 20 to 60% by weight, of the optical element 50 and can be selected, for example, from titanium dioxide, zirconium dioxide, aluminum oxide and combinations thereof. The optical element 50 can line at least a part of the recess 25 and thus reflect the generated radiation, thereby increasing the radiation yield of the component 100. Alternatively, the optical element 50 can also form part of the housing 20. The housing 20 can also be made entirely of the polymer material of the optical element 50 and then has a reflective filler at least in the area of the recess.

In this example, the semiconductor chip 10 is encapsulated with a potting 51, whereby the potting 51 can in turn be an optical element 50 according to at least one embodiment of the application.

The exemplary embodiments described in connection with the figures and their characteristics can also be combined with each other according to further exemplary embodiments, even if such combinations are not explicitly shown in the figures. Furthermore, the exemplary embodiments described in connection with the figures may have additional or alternative features as described in the general part.

The invention is not limited by the description of the exemplary embodiments to these. Rather, the invention includes each new feature as well as the combination of features, which in particular includes each combination of features in the patent claims, even if that feature or combination itself is not explicitly stated in the patent claims or exemplary embodiments.

The invention claimed is:

1. An optoelectronic component comprising:
   an optical element comprising silicone as a polymer material,
   wherein the silicone has repeating units of cyclic siloxane and of linear siloxane which are arranged in alternation,
   wherein the silicone has the following structural formula:

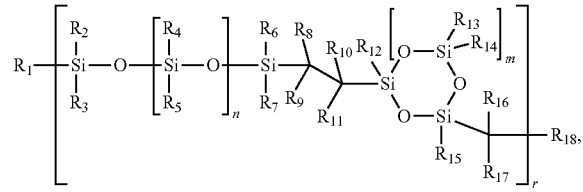

wherein $R_1$ to $R_{18}$ are independently selected from the group consisting of H, alkyl, alkylene, alkylarylene, cycloalkyl and aryl,
n is selected between 1 and 1000 inclusive,
m is selected between 1 and 3 inclusive, and
r is selected between 1 and 100 inclusive, and
wherein the optoelectronic component is configured to emit radiation.

2. The optoelectronic component according to claim 1, wherein $R_1$ comprises a vinyl group and $R_{18}$ is H.

3. The optoelectronic component according to claim 1, wherein m is equal to 2.

4. The optoelectronic component according to claim 1, wherein m=2, $R_1$ is a vinyl-containing radical and $R_{12}$ to $R_{14}$ are each H.

5. The optoelectronic component according to claim 1, wherein the cyclic siloxane and the linear siloxane are linked by hydrosilylation.

6. The optoelectronic component according to claim 1, wherein the cyclic siloxane and the linear siloxane are mixed in a ratio of 1:1 to 1:10.

7. The optoelectronic component according to claim 1, wherein the optical element is formed as a potting surrounding a semiconductor chip.

8. The optoelectronic component according to claim 1, further comprising converter materials embedded in the optical element.

9. The optoelectronic component according to claim 1, wherein the optical element is formed as a lens or a reflector.

10. A method for producing an optoelectronic component, the method comprising:
    forming an optical element by:
    providing a first material comprising a cyclic siloxane;
    providing a second material comprising a linear siloxane, wherein one of the two siloxanes is a silane and the other one has at least one double bond;
    adding a catalyst; and
    crosslinking the cyclic siloxane and the linear siloxane by hydrosilylation thereby producing silicone as a polymer material
    wherein the silicone has the following structural formula:

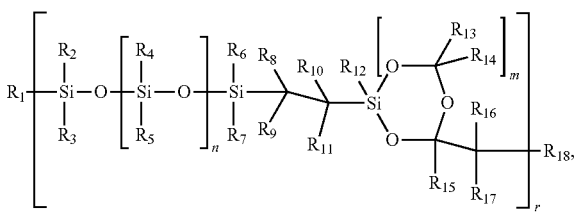

wherein $R_1$ to $R_{18}$ are independently selected from the group consisting of H, alkyl, alkylene, alkylarylene, cycloalkyl and aryl,
n is selected between 1 and 1000 inclusive,
m is selected between 1 and 3 inclusive, and
r is selected between 1 and 100 inclusive.

11. The method according to claim 10, wherein crosslinking comprises crosslinking at 100° C. to 150° C.

12. The method according to claim 10, wherein the catalyst is a platinum catalyst.

13. An optoelectronic component:
    an optical element comprising silicone as a polymer material, the silicone having repeating units of cyclic siloxane and of linear siloxane which are arranged in alternation, wherein the linear siloxane has the following structural unit:

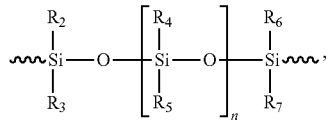

wherein $R_2$ to $R_7$ are independently selected from the group consisting of H, alkyl, alkylene, alkylarylene, cycloalkyl and aryl, and n is selected between 1 and 1000 inclusive, wherein the cyclic siloxane has the following structural unit:

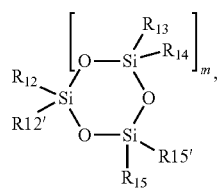

wherein $R_{12}$ to $R_{15}$ are independently selected from the group consisting of H, alkyl, alkylene, alkylarylene, cycloalkyl and aryl, and m is selected between 1 and 3 inclusive, wherein the optical element is formed as a potting surrounding a semiconductor chip, and/or wherein the optical element is formed as a lens or a reflector, and wherein the optoelectronic component is configured to emit radiation.

14. The optoelectronic component according to claim 13, wherein m is equal to 2.

15. The optoelectronic component according to claim 13, wherein m=2, $R_1$ is a vinyl-containing radical and $R_{12}$ to $R_{14}$ are each H.

16. The optoelectronic component according to claim 13, wherein the cyclic siloxane and the linear siloxane are mixed in a ratio of 1:1 to 1:10.

17. The optoelectronic component according to claim 13, wherein the optical element is formed as a lens or a reflector.

18. The optoelectronic component according to claim 13, further comprising converter materials embedded in the optical element.

19. The optoelectronic component according to claim 13, wherein the silicone has the following structural formula:

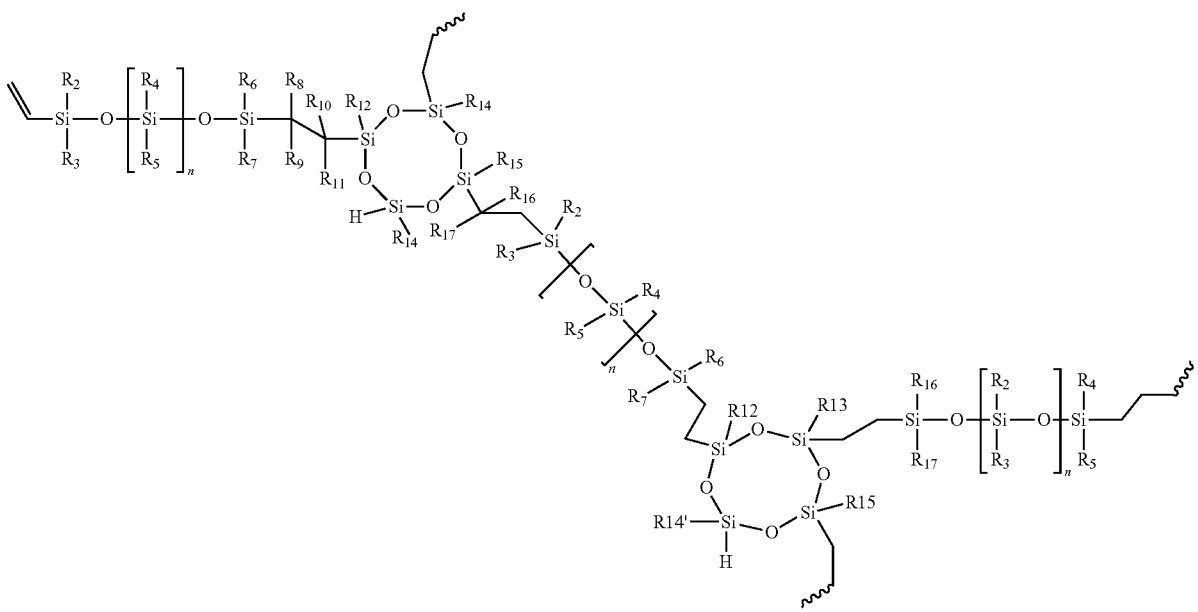

wherein $R_2$ to $R_{17}$ are independently selected from the group consisting of H, alkyl, alkylene, alkylarylene, cycloalkyl, siloxane and aryl, and wherein n is selected between 1 and 1000 inclusive.

* * * * *

UNITED STATES PATENT AND TRADEMARK OFFICE
CERTIFICATE OF CORRECTION

PATENT NO. : 10,910,531 B2
APPLICATION NO. : 16/328680
DATED : February 2, 2021
INVENTOR(S) : Wenderoth Page 1 of 1

It is certified that error appears in the above-identified patent and that said Letters Patent is hereby corrected as shown below:

In the Claims

In Column 12, Lines 42-52, Claim 10, delete the equation and insert:

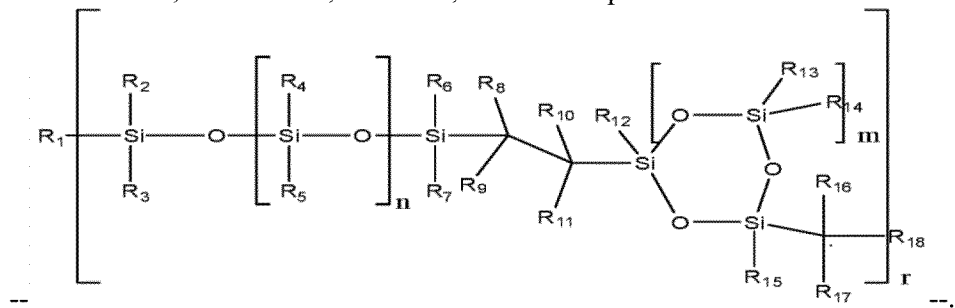

In Columns 13 and 14, Lines 28-52, Claim 19, delete the equation and insert:

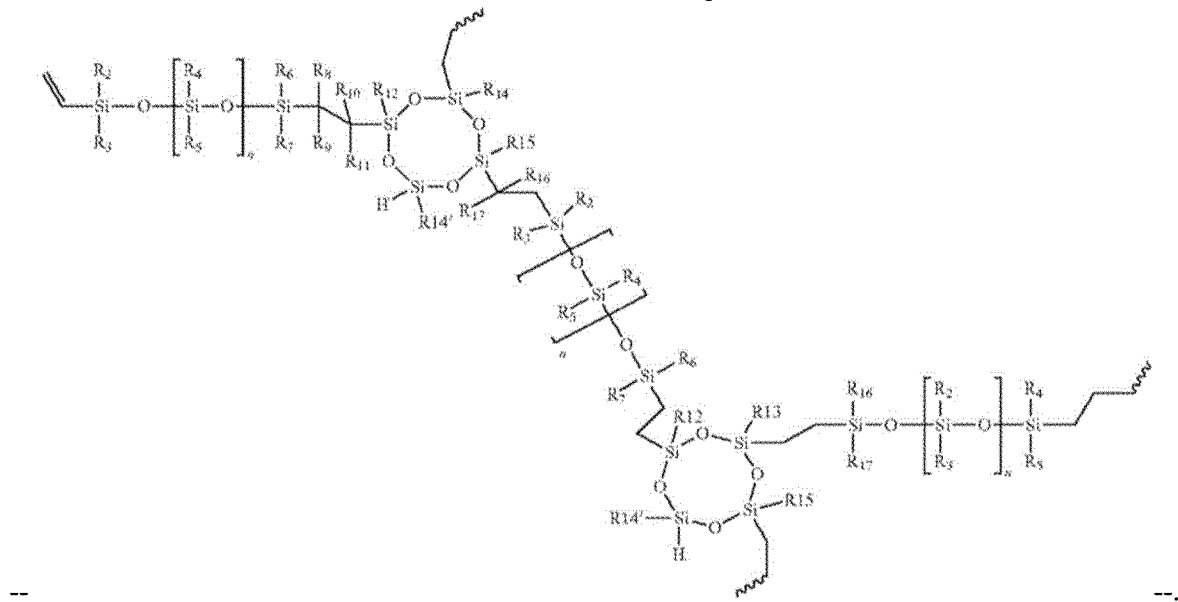

Signed and Sealed this
Tenth Day of August, 2021

Drew Hirshfeld
*Performing the Functions and Duties of the*
*Under Secretary of Commerce for Intellectual Property and*
*Director of the United States Patent and Trademark Office*